United States Patent [19]

Reedy et al.

[11] Patent Number: 5,895,957

[45] Date of Patent: Apr. 20, 1999

[54] MINIMUM CHARGE FET FABRICATED ON AN ULTRATHIN SILICON ON SAPPHIRE WAFER

[75] Inventors: Ronald E. Reedy; Mark L. Burgener. both of San Diego, Calif.

[73] Assignee: Peregrine Semiconductor Corporation. San Diego, Calif.

[*] Notice: This patent is subject to a terminal disclaimer.

[21] Appl. No.: 08/778,669

[22] Filed: Jan. 3, 1997

Related U.S. Application Data

[60] Continuation of application No. 08/408,034, Mar. 21, 1995, Pat. No. 5,600,169, which is a division of application No. 08/090,400, Jul. 12, 1993, Pat. No. 5,416,043.

[51] Int. Cl.⁶ .................... H01L 27/01; H01L 27/12; H01L 29/76
[52] U.S. Cl. .................... 257/352; 257/353; 257/66
[58] Field of Search .................... 257/57, 66, 64, 257/65, 69, 347, 348, 349, 350, 351, 352, 353, 354

[56] References Cited

U.S. PATENT DOCUMENTS

| | | |
|---|---|---|
| 3,562,608 | 2/1971 | Gallagher et al. .................... 257/288 |
| 3,829,881 | 8/1974 | Kohashi .................... 257/532 |
| 4,177,084 | 12/1979 | Lau et al. . |
| 4,198,649 | 4/1980 | Berry . |
| 4,385,937 | 5/1983 | Ohmura . |
| 4,418,470 | 12/1983 | Naster et al. . |
| 4,425,700 | 1/1984 | Sasaki et al. . |
| 4,463,492 | 8/1984 | Maeguchi . |
| 4,509,990 | 4/1985 | Vasudev . |
| 4,523,963 | 6/1985 | Ohta et al. . |
| 4,588,447 | 5/1986 | Golecki . |
| 4,607,176 | 8/1986 | Burrows et al. . |
| 4,615,762 | 10/1986 | Jastrzebski et al. .................... 156/628 |
| 4,617,066 | 10/1986 | Vasudev .................... 148/1.5 |
| 4,659,392 | 4/1987 | Vasudev .................... 148/1.5 |
| 4,766,482 | 8/1988 | Smeltzer et al. .................... 257/350 |
| 4,775,641 | 10/1988 | Duffy et al. .................... 438/149 |
| 4,843,448 | 6/1989 | Garcia et al. .................... 257/347 |
| 5,027,171 | 6/1991 | Reedy et al. .................... 257/315 |
| 5,141,882 | 8/1992 | Komori et al. .................... 438/220 |
| 5,229,644 | 7/1993 | Wakai et al. .................... 257/66 |
| 5,294,823 | 3/1994 | Eklund et al. .................... 257/347 |
| 5,300,443 | 4/1994 | Shimabukuro et al. .................... 438/199 |

FOREIGN PATENT DOCUMENTS

| | | |
|---|---|---|
| 61-103530 | 9/1986 | Japan . |
| 62-176145 | 1/1988 | Japan . |
| 4-122020 | 8/1992 | Japan . |
| WO 89/07367 | 8/1989 | WIPO . |

OTHER PUBLICATIONS

Golecki et al., "Recrystallization of Silicon–on–Sapphire by CW Ar Laser Irradiation: Comparison Between the Solid and the Liquid–Phase Regimes"; Appl. Phys. Lett. 37(10), 1980, pp. 919–921.

Inoue et al. "Crystaline Disorder Reduction and Defect–Type Change in Silicon–on–Sapphire Films by Silicon Implantation and Subsequent Thermal Annealing"; Appl. Phys. Lett. 36(1), 1980, pp. 64–66.

Golecki et al., "Improvement of Crystalline Quality of Epitaxial Silicon–on–Sapphire by Ion–Implantation and Furnace Regrowth"; Solid State Electronics vol. 23, 1980, 803–806.

Linnros et al., "Ion–Beam Induced Epitaxial Regrowth of Amorphous Layers in Silicon on Sapphire"; Physical Review B, vol. 30, No. 7, 1984, pp. 3629–3638.

Lau et al., "Improvement of Crystalline Quality of Epitaxial Si Layers by Ion Implantation Techniques"; Appl. Phys. Lett. 34(1), 1979, pp. 76–78.

P.R. de la Houssaye, et al., "Fabrication of n–channel metal–oxide–semiconductor field–effect transistors with 0.2μm gate lengths in 500 A thin film silicon on sapphire", Journal of Vacuum Science and Technology: Part B, vol. 10, No. 6, pp. 2954–2957, Nov./Dec. 1992.

P.H. Woerlee, et al., "Half–Micron CMOS on Ultra–Thin Silicon on Insulator", Technical Digest of the International Electron Devices Meeting 1989, Washington, D.C., pp. 821–824, Dec. 3–6, 1989.

Nobuo Sasaki et al., "A CMOS/SOS Synchronous Static RAM Fabricated with an Advanced SOS Technology", Japanese Journal of Applied Physics, Supplement 18–1, vol. 18, pp. 57–62, 1979.

Adele E. Schmitz et al., "A Deep–Submicrometer Microwave/Digital CMOS/SOS Technology", IEEE Electron Device Letters, vol. 12, No. 1, pp. 16–17, Jan. 1991.

Tsu–Jae King et al., A Low–Temperature "(≤550°C) Silicon–Germanium MOS Thin–Film Transistor Technology for Large–Area Electronics", Technical Digest of the International Electron Devices Meeting 1991, Washington, D.C., pp. 567–570, Dec. 8–11, 1991.

R.E. Reedy et al., "Characterization of Defect Reduction and Aluminum Redistribution in Silicon Implanted SOS Films", Journal of Crystal Growth, vol. 58, No. 1, pp. 53–60, Jun. 1982.

R.E. Reedy et al., "Suppressing Al Outdiffusion in Implantation Amorphized and Recrystallized Silicon on Sapphire Films", Applied Physics Letters, vol. 42, No. 8, pp. 707–709, Apr. 1983.

G.A. Garcia et al., "High–Quality CMOS on Thin (100 nm) Silicon on Sappphire", IEEE Electron Device Letters, vol. 9, No. 1, pp. 32–34, Jan. 1988.

R.E. Reedy et al., "Thin (100 nm) SOS for Application to Beyond VLSI Microelectronics"Mat. Res. Soc. Symp. Proc., vol. 107, pp. 365–376, 1988.

Reedy et al.; "(100nm) SOS for application to beyond VLSI microelectronics"; MAt. Res. Soc. Proc., vol. 107, pp. 365–376.

*Primary Examiner*—Wael Fahmy
*Attorney, Agent, or Firm*—Dennis H. Epperson

[57] ABSTRACT

A process is disclosed for preparing a silicon-on-sapphire wafer suited for fabrication of fully depleted field effect transistors. A fully depleted field effect transistor (FET) which has minimum parasitic charge in the conduction channel and a process to make same are described. The device is made in and relies on the silicon layer on sapphire which has minimal charge intentionally introduced into the conduction channel. Both N-type and P-type transistors are described. Methods for defining threshold voltage are also described. Specific examples of the devices are presented including specific materials selections for threshold voltage options.

Manufacturing processes are described, including a preferred embodiment based on ultra thin silicon on sapphire. The devices can be fabricated using conventional silicon techniques; both silicided and non-silicided versions are presented.

Advantages include threshold voltages determined by fundamental material properties; high performance devices due to reduced carrier scattering, low transverse electric fields and elimination of the body effect; threshold voltages virtually independent of temperature; simplicity of modeling due to reduction or elimination of parasitic effects; device and process simplicity; ease of scaling and an option for inherently symmetric threshold voltages for N-channel and P-channel MOSFETs (i.e. $|V_{tn}|=|V_{tp}|$).

3 Claims, 13 Drawing Sheets

MINIMUM CHARGE FET FABRICATED ON AN ULTRATHIN SILICON ON SAPPHIRE WAFER

This application is a continuation of application Ser. No. 08/408,034; filed on Mar. 21, 1995, now U.S. Pat. No. 5,600,169 which is a divisional of application Ser. No. 08/090,400; filed on Jul. 12, 1993, now U.S. Pat. No. 5,416,043.

FIELD OF THE INVENTION

The current invention relates generally to the fabrication of semiconductor-on-insulator composite substrates, such as silicon-on-sapphire (SOS), and more particularly to devices, structures and processes for providing transistors in integrated circuits in silicon-on-sapphire material.

BACKGROUND OF THE INVENTION

The field effect transistor (FET) controls current conduction from a source region to a drain region by application of voltage to a gate conductor. If the gate conductor is insulated from the source-drain conduction channel, the device is called an insulated gate FET. The most common gate structure is that of metal oxide semiconductor, or the MOSFET. A variety of requirements force designs which contain doped semiconductor material below the insulating gate structure, i.e., in the conduction channel. As device dimensions shrink, doping concentrations must be increased to maintain proper transistor operation.

Dopant atoms and electrically active states (hereinafter called "fixed charge") in the conduction channel region of MOSFETs are charged and discharged during operation of the device. Since fixed charge is immobile, it does not contribute to FET current conduction. Therefore, the charging and discharging of fixed charges introduces parasitic charge to the transistor with many negative effects, including scattering of conduction carriers; variation in threshold voltage; introduction of buried channel operation; introduction of a body effect; complication of device modeling; increased complexity for device and process design; increased electric fields; and difficulty in scaling devices to smaller dimensions or voltages, among others.

Dopant atoms are introduced into MOSFETs for specific reasons such as to adjust threshold voltage or to control substrate currents, with the aforementioned adverse side effects accepted as necessary by-products of dopant atom introduction. It would be very desirable to be able to introduce only the specific type, quantity and location of dopant atoms which are necessary to achieve the desired electrical characteristics for the device and to avoid or eliminate all other dopant atoms. The "ideal" semiconductor material would thus include a completely monocrystalline, defect-free silicon layer of sufficient thickness to accommodate the fabrication of active devices thereon. Ideal operation of MOSFETs would occur if there were no parasitic charge (which we define as unintended or excess dopant atoms plus electrically active states) in the conduction channel.

Another requirement for MOSFETs is to set threshold voltage, which is the gate voltage necessary to initiate conduction. A common technique for setting threshold voltage is to modify the dopant concentrations in the channel region. However, this approach has the undesirable side effects associated with dopant charge mentioned above. Also, adjusting threshold voltage by ion implantation requires at least two and often four masking steps which increase cost and decrease yield.

Previously, silicon-on-sapphire (SOS) has been used for high performance MOSFET microelectronics, primarily for applications requiring radiation hardness. Typically, a silicon film is epitaxially grown on a sapphire substrate. Ideally, the silicon film is thin compared to the source to drain separation (called the channel length) and the insulating substrate is thick enough to ensure no significant electrostatic coupling to a back plane. Due to crystal and thermal expansion mismatches between the silicon and the sapphire, the silicon films are typically heavily populated with crystalline defects and electrically active states. The dominant type of crystalline defects are commonly called "twins". The quality of the silicon films can be improved by increasing the thickness of the silicon, hence traditional SOS is made with silicon films between 400 and 800 nanometers thick. This film thickness is capable of supporting transistors with channel lengths down to about 1 micron. Submicron channel length devices cannot be made in traditional SOS materials as thinner films are required.

The advantages of utilizing a composite substrate comprised of a monocrystalline semiconductor layer, such as silicon, epitaxially deposited on a supporting insulative substrate are well recognized. These advantages include the substantial reduction of parasitic capacitance between charged active regions and the substrate and the effective elimination of leakage currents flowing between adjacent active devices. This is accomplished by employing as the substrate an insulative material, such as sapphire ($Al_2O_3$), and providing that the conduction path of any interdevice leakage current must pass through the substrate.

An "ideal" silicon-on-sapphire wafer may be defined to include a completely monocrystalline, defect-free silicon layer of sufficient thickness to accommodate the fabrication of active devices therein. The silicon layer would be adjacent to a sapphire substrate and would have a minimum of crystal lattice discontinuities at the silicon-sapphire interface. Previous attempts to fabricate this "ideal" silicon-on-sapphire (SOS) wafer have been frustrated by a number of significant problems.

Historically, the first significant problem encountered in attempts to fabricate the ideal SOS wafer was the substantial incursion of contaminants into the epitaxially deposited silicon layer. In particular, substantial concentrations of aluminum contaminants, diffused from the sapphire substrate, were found throughout the silicon epitaxial layer. The inherent consequence of a high concentration of aluminum contaminants, effectively acting as acceptor-type impurities in the silicon epitaxial layer, is that there are unacceptably high leakage currents between the source and drain regions of P-channel active devices, such as MOSFETs (Metal Oxide Semiconductor Field Effect Transistor) and MESFETs (MEtal Semiconductor FET). These leakage currents may be of sufficient magnitude that the P-channel active devices may be considered to be always in an "on", or conducting state.

The incursion of substrate-oriented contaminants into the silicon layer was found to be an inherent consequence of high temperature processing steps. Such steps are typically utilized in both the initial epitaxial deposition of the silicon layer and the subsequent annealing of the silicon layer to reduce crystalline defects contained therein. Thus, it was recognized that high temperature annealing needed to be avoided to prevent the substantial incursion of substrate-orientated contaminants into the silicon layer.

However, in the absence of a high temperature anneal, a second problem appeared. The crystalline quality of the silicon layer, as epitaxially deposited, was of insufficient quality to permit the fabrication of active devices therein. It was discovered that the dominant crystal defects, i.e., twins, could be eliminated by solid phase epitaxial (SPE) regrowth, a process described in U.S. Pat. No. 4,177,084, entitled "METHOD FOR PRODUCING A LOW DEFECT LAYER OF SILICON-ON-SAPPHIRE WAFER", issued to Lau et al.. As described by Lau et al., the SPE process provides a low temperature subprocess for improving the crystallinity of the silicon epitaxial layer of a silicon-on-sapphire composite substrate. The SPE process involves the high energy implantation (typically at 40 KeV to 550 KeV) of an ion species, such as silicon, into the silicon epitaxial layer at a sufficient dose (typically $10^{15}$ to $10^{16}$ ions/cm$^2$) to create a substantially amorphous silicon layer lying adjacent the silicon/sapphire interface while leaving a substantially crystalline layer at the surface of the original epitaxial layer. The thickness of the silicon epitaxial layer is substantially that intended for the completed silicon-on-sapphire composite substrate (typically 3000 Å–6000 Å). The ion species is implanted through the majority of the epitaxial layer so that the maximum disruption of the silicon crystal lattice is near, but not across, the silicon/sapphire interface to ensure that the amorphous region is adjacent the sapphire substrate. Throughout the ion implantation, the sapphire substrate is kept below about 100° C. by cooling with Freon or liquid Nitrogen. A single step low temperature (600° C.) annealing of the composite substrate is then performed to convert the amorphous silicon layer into crystalline silicon. During this regrowth, the remaining crystalline surface portion of the silicon layer effectively acts as a nucleation seed so that the regrown portion of the silicon epitaxial layer has a common crystallographic orientation and is substantially free of crystalline defects.

While Lau's SPE process does significantly improve the crystallinity of the silicon epitaxial layer, it also facilitates the diffusion of aluminum from the sapphire substrate ($Al_2O_3$) into the silicon epitaxial layer, which dopes the silicon film P-type. The contaminant concentration resulting from the use of the SPE process is, unfortunately, sufficient to preclude the practical use of integrated circuits fabricated on composite substrates processed with this SPE subprocess. The reasons for the failure of active devices to operate correctly are essentially the same as given above with regard to composite substrates fabricated utilizing high temperature processing steps. Additionally, it has been observed that the method described by Lau et al., can leave enough electrically active states in the silicon epitaxial layer to preclude its use for fabrication of integrated circuits.

U.S. Pat. No. 4,509,990, entitled "SOLID PHASE EPITAXY AND REGROWTH PROCESS WITH CONTROLLED DEFECT DENSITY PROFILING FOR HETEROEPITAXIAL SEMICONDUCTOR ON INSULATOR COMPOSITE SUBSTRATES", issued to Vasudev, also describes use of ion implantation and solid phase regrowth to prepare a silicon-on-sapphire wafer. In a first principle embodiment, a method for fabricating a silicon-on-sapphire wafer very similar to that taught by Lau et al. is described with the additional requirement that the implantation energy and the ion dose are constrained such that they are sufficiently low so as not to exceed the damage density threshold of the sapphire substrate. In a second principle embodiment, the method describes a residual high defect density in the silicon layer near the sapphire substrate. Both embodiments utilize a method for controlling the temperature of the rear surface of the sapphire substrate by mounting the substrate on a heat sink with either a thin film of thermal paste or a thin film of silicon positioned intermediate to the rear surface of the substrate and the heat sink to provide a high heat conductivity interface therebetween. During the ion implantation, the temperature of the heat sink is held at a constant temperature (typically between −20° C. and 250° C.) resulting in a substantial thermal gradient between the rear surface of the sapphire and the silicon layer (typically 150° C. to 200° C.). Thus, it follows that the silicon layer is at a temperature falling in the range of 130° C. to 450° C.

It has been found that the process described by Vasudev can result in incomplete and non-uniform removal of crystalline defects and electrically active states from the silicon layer due to non-uniform thermal contact of the rear surface of the sapphire with the heat sink. When the thermal paste is used, any air bubbles in the paste interface can result in the non-uniform control of the silicon layer temperature. Additionally, further processing of the wafer is made more difficult because it is necessary to completely remove all residues of the thermal paste before proceeding. While coating the rear surface of the sapphire with silicon to provide a thermal interface removes the problem of cleaning paste from the wafer before further processing, it has also been found to provide non-uniform temperature control of the silicon layer, due to roughness of the rear surface of the sapphire. Even when great care is taken to smooth the rear surface of the sapphire prior to applying the silicon interface layer, a costly and time consuming process, warping of the substrate caused by heating and cooling of the sapphire during the implantation can result in non-uniform thermal contact between the rear surface of the sapphire and the heat sink.

U.S. Pat. No. 4,659,392, entitled "SELECTIVE AREA DOUBLE EPITAXIAL PROCESS FOR FABRICATING SILICON-ON-INSULATOR STRUCTURES FOR USE WITH MOS DEVICES AND INTEGRATED CIRCUITS", issued to Vasudev, describes another method for tailoring defect densities in regions of silicon on insulator wafers. Using this process, the defect structure and dopant concentrations near the interface between the silicon and the insulator are optimized for specific applications. However, such residual defects would make such silicon films inappropriate for construction of fully depleted transistors.

Other methods to prepare silicon on sapphire films have been described. U.S. Pat. No. 4,385,937, entitled "REGROWING SELECTIVELY FORMED ION AMORPHOSIZED REGIONS BY THERMAL GRADIENT", issued to Ohmura, describes a method which uses large thermal gradients during solid phase regrowth to enhance electron mobility in the silicon semiconductor layer. U.S. Pat. No. 4,775,641, entitled "METHOD OF MAKING SILICON-ON-SAPPHIRE SEMICONDUCTOR DEVICES", issued to Duffy et al., describes a method which intentionally forms a silicon layer adjacent an insulating substrate which has a high density of naturally occurring crystallographic defects. The purpose of this region is to substantially reduce the back-channel leakage that occurs when the device is operated after being irradiated. U.S. Pat. No. 4,588,447, entitled "METHOD OF ELIMINATING P-TYPE ELECTRICAL ACTIVITY AND INCREASING CHANNEL MOBILITY OF SI-IMPLANTED AND RECRYSTALLIZED SOS FILMS", issued to Golecki, describes use of ion implantation, recrystallization and oxygen diffusion to neutralize aluminum in the silicon film. The resulting oxide layer on the outward surface is subsequently densified and etched away. U.S. Pat. No. 4,523,963, entitled "METHOD OF FABRICATING MOS DEVICE ON A SOS WAFER BY STABILIZING INTERFACE REGION WITH SILICON AND OXYGEN IMPLANT", issued to Ohta, et al. describes use of implanting both silicon and oxygen to form recrystallized silicon films. An insulating layer is intentionally formed at the interface of the sapphire substrate. This insulating layer contains a high density of crystalline defects and dopants.

The paper entitled "THIN (100 nm) SOS FOR APPLICATION TO BEYOND VLSI MICROELECTRONICS", published in the Mat. Res. Soc. Symp. Proc. Vol. 107, pp. 365–376, 1988, authored by Reedy et al. discusses preparation techniques for SOS films using a double anneal with temperatures as high as 1050° C. Mention is made that adequate thermal contact must be made to prevent self annealing, however, no method of providing such contact is disclosed. Characteristics of bulk silicon and the SOS films thus produced are compared. Likewise, it is noted that N- and P-channel transistors which were fabricated in these SOS films exhibited performance characteristics which rivaled those of similar devices fabricated in bulk silicon. However, there is no discussion of fully depleted transistor operation in this paper.

The paper entitled "HIGH-QUALITY CMOS IN THIN (100 nm) SILICON ON SAPPHIRE", published in IEEE Electron Device Letters, Vol. 9, No. 1, pp. 32–34, January, 1988, authored by Garcia et al., presents substantially the same information as the above referenced Reedy et al. paper with more emphasis placed on the characteristics of the enhancement-mode N- and P-channel MOSFET's fabricated in the SOS material.

Historically, as summarized above, significant progress has been made in producing SOS material having low concentrations of crystalline defects and substrate contaminates in the silicon. However, none of this work appears to recognize or address the effects or origin of charge states, which may also be present. Additionally, there are no teachings on how to produce SOS materials and devices therein which do not have the undesirable charge states discussed above.

SUMMARY OF THE INVENTION

To overcome limitations of the previously described SOS films and transistors fabricated therein, the present invention comprises a fabrication process which creates a substantially pure silicon film on sapphire. A substantially pure silicon film is defined as one which initially has substantially no dopant atoms or electrically active states, either in the silicon film or at either top or bottom interface. Substantially no electrically active states is defined as an areal density of electrically active states which is approximately $3 \times 10^{11}$ cm$^{-2}$ to $5 \times 10^{11}$ cm$^{-2}$. The present invention starts with a silicon film epitaxially deposited onto a sapphire substrate. Ion implantation, solid phase regrowth and anneals are performed to eliminate crystalline defects and electrically active states without causing aluminum outdiffusion from the sapphire substrate into the silicon film.

Ion implantation species, dose and energy are specified with respect to the silicon film thickness. Substrate and silicon film temperatures are controlled during the ion implantation step to control proper amorphization and to ensure that no states are introduced or left in the silicon by ion implantation induced thermal affects. Certain anneal conditions are maintained during post solid phase regrowth processing. In particular, anneals in non-oxidizing conditions are performed at temperatures below 950° C. Above that temperature, it has been discovered that electrically active states may be introduced into the silicon film.

In accordance with the current invention, a starting material structure is described which is an intrinsic silicon film (i.e., contains no dopant atoms) on a sapphire substrate with substantially no electrically active states throughout the structure. The current invention describes how to manufacture such a structure and how to maintain its properties throughout a device fabrication process.

The current invention further describes fully depleted transistors fabricated in the substantially pure silicon on sapphire material. During MOSFET operation, a depletion region forms under the control gate. In the present invention, the depletion region extends throughout the silicon film and reaches the silicon-sapphire interface before the conduction channel inverts. This is called a fully depleted transistor. Fully depleted operation has the following desired effects: high performance devices due to reduced carrier scattering; inherently tight threshold voltage control; elimination of buried channel operation; elimination of body effects; simplicity of modeling due to reduction of or elimination of parasitic effects; device and process simplicity; low transverse electric fields; ease of scaling to smaller device dimensions and operating voltages; and an option for inherently symmetric threshold voltages for N and P channel MOSFETs (i.e. $|V_{tn}|=|V_{tp}|$). These advantages result primarily from elimination of virtually all parasitic charge in the channel region and from fully depleted operation.

The current invention further comprises process descriptions which ensure these properties are maintained in the channel region of MOSFETs at the end of an integrated circuit manufacturing process. Thus, the current invention comprises materials, processes and structures which result in fully depleted transistor operation in silicon films on sapphire substrates with minimum parasitic charge in the conduction channel.

In one embodiment, the present invention discloses a method of fabricating a silicon on sapphire wafer having an intrinsic silicon layer on a sapphire substrate. The method comprises the steps of: epitaxially depositing a layer of silicon on a surface of a sapphire substrate; implanting a given ion species into the layer of silicon under such conditions that the implanted ions form a buried amorphous region in the silicon layer which extends substantially from the surface of the sapphire substrate into the layer of silicon, thus leaving a surface layer of monocrystalline silicon covering the buried amorphous region; maintaining the layer of silicon at or below a predetermined temperature which is substantially uniform throughout the layer of silicon during the ion implanting step; and annealing the wafer to induce solid phase epitaxial regrowth of the buried amorphous region using the surface layer of monocrystalline silicon as a crystallization seed.

In a further embodiment, the implanting step further comprises the step of selecting the energy and intensity of the implanting ions from within a range of energy and intensity values having a lower limit which is sufficient to amorphize the buried region of silicon and an upper limit which is insufficient to release substrate-originated contaminants into the silicon layer.

Another embodiment of the method further comprises the step of performing a high temperature anneal sequence at or below approximately 950° C. in a non-oxidizing environment thereby removing residual defects in the layer of silicon without introducing bandgap or interface states. Additionally, the step of performing a high temperature anneal sequence in a non-oxidizing environment to remove residual defects in the layer of silicon without introducing bandgap or interface states further comprises selecting the temperature of the high temperature anneal to be within the range of from approximately 900° C. to approximately 950° C.

In yet another embodiment, the method further comprises the steps of: oxidizing a portion of the layer of silicon thereby leaving a thin layer of intrinsic silicon interposed between the sapphire substrate and the oxidized layer; and etching away the oxidized layer. Additionally, the method may further comprise the step of controlling the steps of oxidizing and etching to reduce the layer of silicon on the sapphire substrate to a thickness which is in the range of from approximately 50 nm to approximately 110 nm.

In another embodiment, the step of maintaining the layer of silicon at or below a predetermined temperature may further include selecting the predetermined temperature to be approximately equal to room temperature. Alternatively, the step of maintaining the layer of silicon at or below a predetermined temperature further comprises selecting the predetermined temperature to be approximately equal to zero degrees centigrade (0° C.).

In another embodiment, the step of annealing the wafer to induce solid phase epitaxial regrowth of the buried amorphous region further comprises selecting the temperature of the annealing step to be within the range of from approximately 500° C. to approximately 600° C.

In a further embodiment, the step of implanting a given ion species into the layer of silicon further comprises the steps of: selecting silicon as the given ion species; and selecting the energy and intensity of the silicon ions from within a range of energy and intensity values having a lower limit which is sufficient to amorphize the buried region of silicon and an upper limit which is insufficient to release substrate-originated contaminants into the silicon layer. Additionally, the step of selecting the silicon ion energy further includes selecting the silicon ion energy to be within the range of from approximately 185 keV to approximately 200 keV. Furthermore, the step of selecting the silicon ion intensity further includes selecting the silicon ion intensity to be within the range of from approximately $5 \times 10^{14}$ cm$^{-2}$ to approximately $7 \times 10^{14}$ cm$^{-2}$.

In yet another embodiment of the method, the step of maintaining the layer of silicon at or below a predetermined temperature which is substantially uniform throughout the layer of silicon during the ion implanting step further comprises flooding a surface of the sapphire substrate which does not have the layer of silicon deposited thereon with a cooled gas.

In one embodiment of the method the step of epitaxially depositing a layer of silicon on a surface of a sapphire substrate further comprising controlling the deposition to produce a silicon layer having a thickness in the range of from approximately 250 nm to approximately 270 nm.

The invention is also embodied as a device comprising: a sapphire substrate having a first surface; and a layer of silicon substantially free of crystalline defects and charge states deposited on the first surface of the sapphire substrate. Preferably, the layer of silicon has a predetermined thickness which is less than approximately 270 nm. Additionally, the layer of silicon has an areal density of electrically active states which is less than approximately $5 \times 10^{11}$ cm$^{-2}$.

The present invention may also be embodied as a silicon-on-sapphire wafer wherein the silicon layer is less than approximately 270 nm thick and has an areal density of electrically active states which is less than approximately $5 \times 10^{11}$ cm$^{-2}$, wherein the wafer is produced by the process comprising the steps of: epitaxially depositing a layer of silicon on a surface of a sapphire substrate; implanting a given ion species into the layer of silicon under such conditions that the implanted ions form a buried amorphous region in the silicon layer which extends substantially from the surface of the sapphire substrate into the layer of silicon, thus leaving a surface layer of monocrystalline silicon covering the buried amorphous region; maintaining the layer of silicon at or below a predetermined temperature which is substantially uniform throughout the layer of silicon during the ion implanting step; and annealing the wafer to induce solid phase epitaxial regrowth of the buried amorphous region using the surface layer of monocrystalline silicon as a crystallization seed.

Another embodiment of the invention is a MOSFET comprising: a sapphire substrate; and a layer of silicon deposited on the sapphire substrate wherein the layer of silicon further comprises: a source region; a drain region; and a channel region, wherein the channel region is less than approximately 270 nm thick and has an areal density of electrically active states which is less than approximately $5 \times 10^{11}$ cm$^{-2}$ thereby capable of being fully depleted. Additionally, the source region and/or the drain region may further comprise dopant atoms.

In another MOSFET embodiment, the channel region further comprises dopant atoms in a concentration which has a lower limit which is sufficient to induce surface channel conduction and an upper limit which does not prevent full depletion of the channel region.

The MOSFET embodiment may further include a gate dielectric layer adjacent the channel region and a gate conductor layer adjacent the gate dielectric layer. Additionally, the gate conductor layer further comprises N$^+$ polysilicon in contact with the gate dielectric layer. Alternatively, the gate conductor layer further comprises P$^+$ polysilicon in contact with the gate dielectric layer. In some embodiments, the gate conductor layer further comprises a material having a metal work function which is in the range of from 4.5 eV to 4.7 eV. For example, the material having a metal work function which is in the range of from 4.5 eV to 4.7 eV may be selected from a group of materials which includes P$^+$ polygermanium, tungsten, chromium, indium tin oxide and titanium nitride.

Another MOSFET embodiment of the invention comprises a sidewall spacer adjacent the gate dielectric layer and adjacent the gate conductor layer.

Other embodiments of the MOSFET invention may include a lightly doped source region and/or a lightly doped drain region.

These and other characteristics of the present invention will become apparent through reference to the following detailed description of the preferred embodiments and accompanying drawings.

DETAILED DESCRIPTION OF THE PREFERRED EMBODIMENTS

The present invention will now be described with reference to the FIGURES. Like reference numbers refer to like or similar regions depicted in the FIGURES. It is to be understood that the several views and the present descriptions are by way of example and that the scope of the current invention is not limited by such views or descriptions. It is understood that both N- and P-type MOSFETs can be made simultaneously on the same sapphire substrate, as shown throughout FIGS. 2 and 3, thereby comprising complimentary MOS (or CMOS) circuits.

In one embodiment, the present invention is in the form of an ultrathin intrinsic silicon film on an insulating sapphire substrate wherein the silicon film contains extremely low concentrations of charge states and a process for making same. Ideally, the intrinsic silicon contains no dopant atoms or electrically active states, either within the silicon film or at the interface between the silicon and the sapphire. While complete elimination of all charge states and dopant atoms is not feasible, trace amounts are acceptable within tolerances determined by the application. For example, if a threshold voltage is to be set to an accuracy of $\delta$ Volts, the total charge in the silicon film should be less than about $\delta/C_{ox}$, where $C_{ox}$ is the gate oxide capacitance per unit area. Other tolerances can be determined similarly. For example, if the threshold voltage is to be accurate to within $\Delta V_t = 50$ mV (0.05 V) of the desired value as determined by the metal work function, and a 5 nm thick $SiO_2$ dielectric layer is the gate insulator, then the total number of fixed charges $\Delta N$ (i.e., dopant charge plus band gap states plus interface states plus fixed charge in the insulators) in the structure should be less than $\Delta V_t C_{ox}/q$, where q is the charge on the electron. Thus, in this example, $\Delta N$ should be less than approximately $2 \times 10^{11}$ cm$^{-2}$, which is typical of most current devices. However, certain applications may require tighter threshold voltage control, thereby requiring that the total allowable fixed charge in the silicon film be less than approximately $3 \times 10^{11}$ cm$^{-2}$ while other applications may tolerate total allowable fixed charge up to as much as $5 \times 10^{11}$ cm$^{-2}$.

Figure 1A:
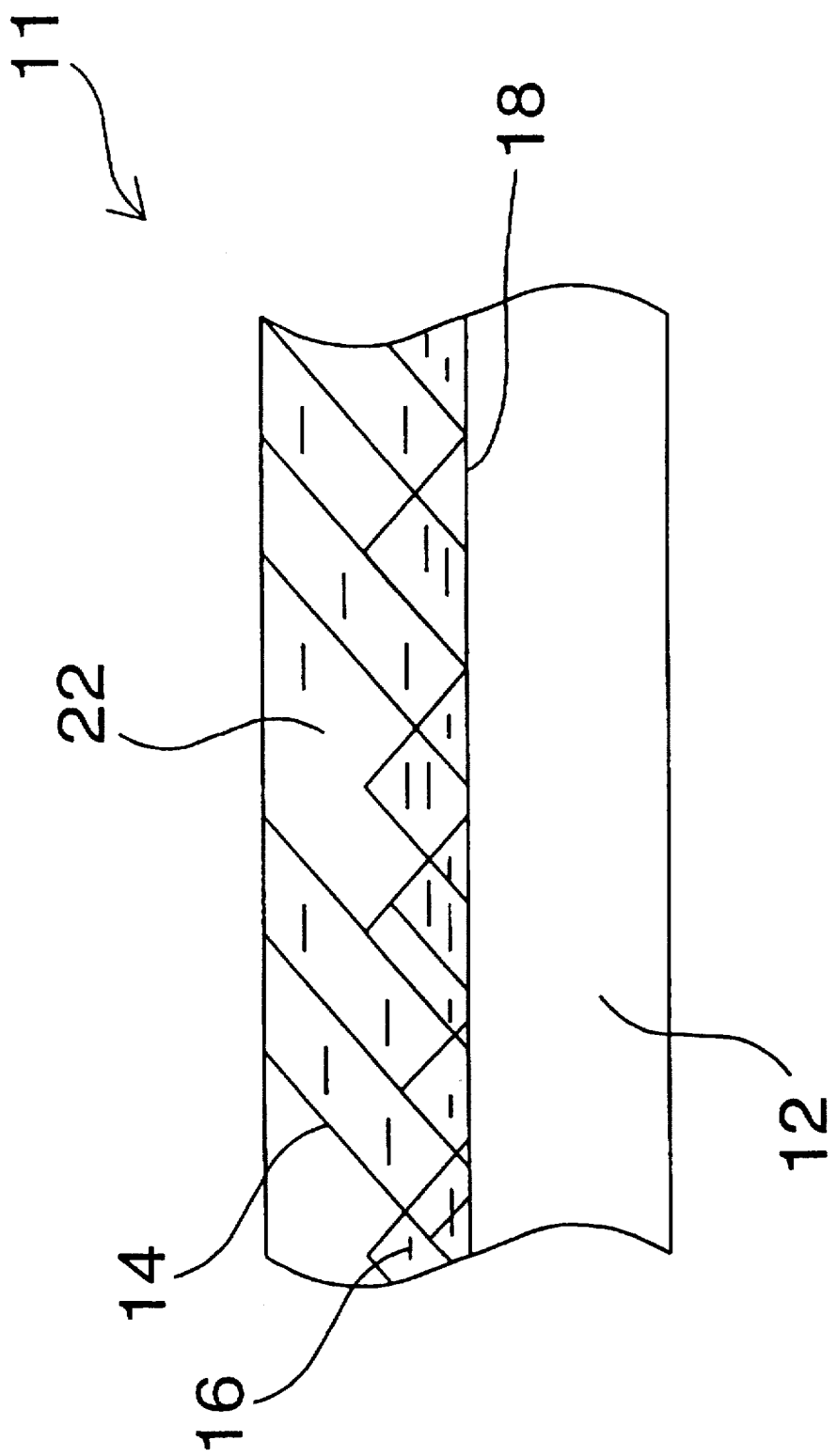
FIGS. 1A–1E illustrate steps in the process of converting an epitaxial silicon on sapphire wafer into a substantially pure silicon on sapphire wafer.

In a preferred embodiment, as shown in FIG. 1A, a 270 nm thick intrinsic silicon film 22 is deposited on a sapphire substrate 12 by epitaxial deposition to form a silicon-on-sapphire wafer 11. After the epitaxial deposition, the silicon film 22 contains a concentration of twin defects 14 and electrically active states 16. The thickness of the silicon film 22 is controlled during the epitaxial deposition process using standard processes.

Figure 1B:
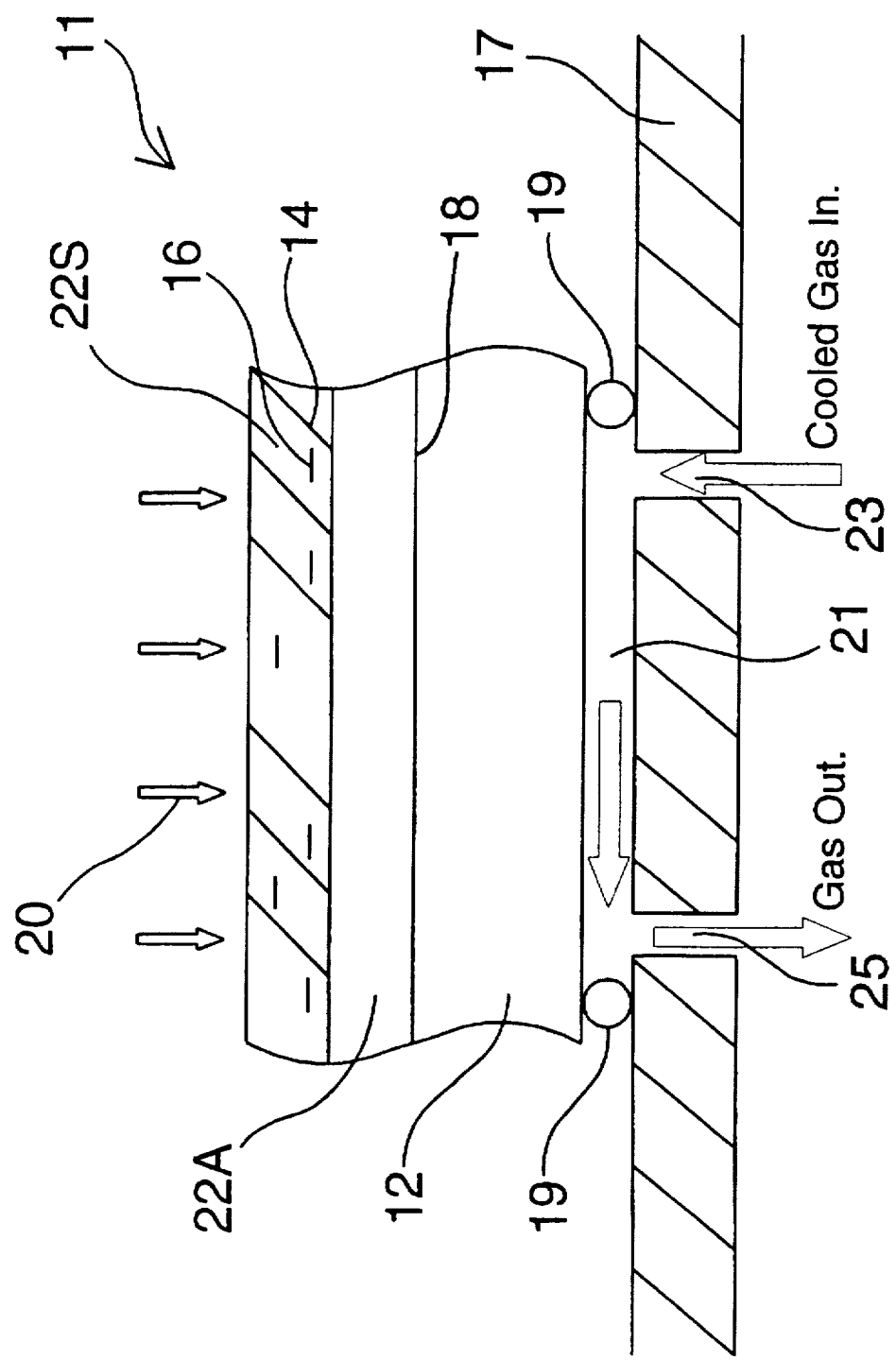

Referring to FIG. 1B, a 185 keV Beam of Si ions 20 is implanted into the silicon film 22 to a dose of approximately $6 \times 10^{14}$ cm$^{-2}$, thus creating a subsurface amorphous region 22A and leaving a surface monocrystalline silicon region 22S. The energy and dose of the beam of Si ions 20 are selected so that the amorphous region 22A extends from an interface 18 formed between the sapphire substrate 12 and the Si film 22 up into the Si film 22 to a thickness which is greater than the desired final thickness of Silicon film. In this embodiment, the amorphous region 22A is approximately 200 nm thick.

The amorphous region 22A in the 270 nm thick intrinsic silicon film 22 is created by implantation with the Si ion beam having an energy of 185 keV at a dose of $6 \times 10^{14}$ cm$^{-2}$ while maintaining the silicon film 22 at a uniform temperature at or below about 0° C. It has been found that this process will uniformly amorphize layer 22A without causing aluminum atoms to be released from the sapphire substrate 12 into the silicon film 22. While others have reported cooling the substrate by placing it on a cooled heat sink during implantation, none have paid particular attention to the temperature of the silicon film 22 during the implantation nor have they adequately addressed the issue of uniform cooling of the silicon film.

Previous cooling techniques include various techniques for placing the sapphire substrate 12 in contact with a cooled heat sink. Contact between the sapphire substrate and the heat sink was accomplished in a variety of ways including the use of a thermal paste layer interposed between the sapphire and the heat sink; depositing a layer of indium on the sapphire to provide more uniform contact with the heat sink; polishing the sapphire surface to improve contact with the heat sink; etc. However, these techniques created other problems and have been found to be inadequate for forming silicon films free of defects, dopants and charge states. A common shortcoming of these techniques is that it is very difficult to insure that the thermal contact between the sapphire and the heat sink is uniform over the entire sapphire surface. Non-uniform contact results in a nonuniform temperature within the overlying silicon film 22 which creates an amorphous layer 22A which is not uniformly amorphous due to partial self annealing. If the silicon film 22 is held at higher temperatures, the dose and/or energy must be increased to insure amorphization of layer 22A. If the temperature of the silicon film 22 is maintained at too high a temperature or not controlled at all, the ion implantation will cause the substrate temperature to rise, thereby increasing the required dose and/or energy required to amorphize layer 22A to a level where aluminum will outdiffuse from the sapphire 12 into the silicon 22. The present invention overcomes these shortcomings by cooling the sapphire with a flow of cooled gas and by adjusting the gas flow and/or temperature of the gas to insure that the silicon layer 22 is maintained at or below a predetermined temperature. For the dose and energy cited above, the substrate 12 is cooled to a temperature which maintains the surface of the silicon film 22 at a temperature preferably lower than about 0° C. One configuration for accomplishing these objectives is illustrated in FIG. 1B.

Shown in FIG. 1B is a configuration for maintaining the silicon film 22 at a uniform temperature at or below about 0° C. The SOS wafer 11 is positioned on a support structure 17 in a manner which creates a chamber 21 between the sapphire substrate 12 and the support structure 17, for example, by placing an O-ring 19 between the support structure 17 and the SOS wafer 11. Cooled gas is circulated through the chamber 21 to cool the substrate 12. Since the gas has the same thermal contact with all areas of the substrate 12, uniform cooling is assured. Gas enters the chamber 21 through an inlet 23 and exits the chamber through an outlet 25.

Figure 1C:
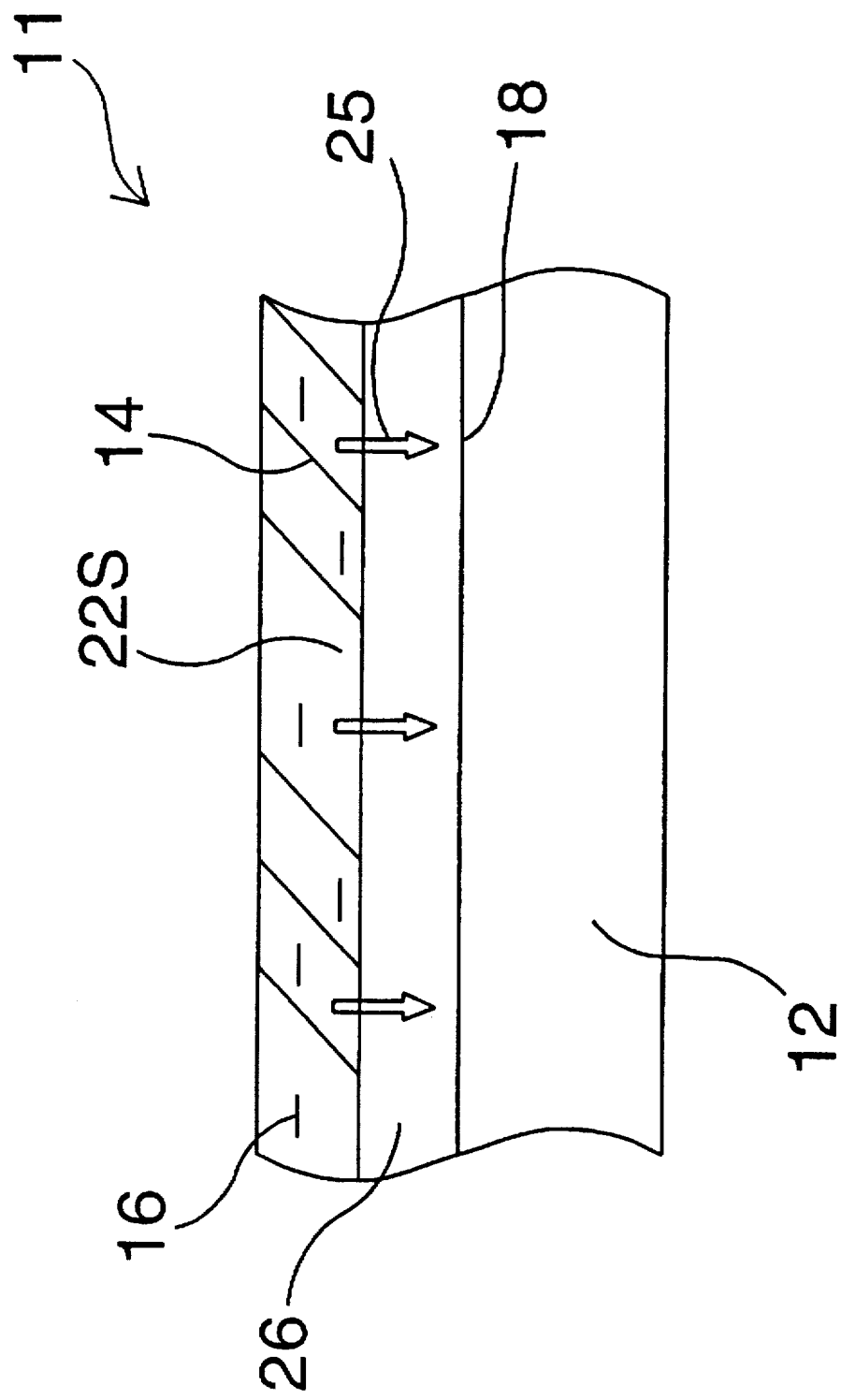

After creating the amorphous region 22A through silicon ion implantation, the SOS wafer 11 is subjected to a thermal anneal step at approximately 550° C. in an inert atmosphere (e.g. nitrogen) to induce solid phase epitaxial regrowth from the surface of the monocrystalline silicon region 22S downward through the amorphous region 22A to the interface 18. Thus the amorphous region 22A is regrown as a single crystal region 26. The direction of the regrowth from the monocrystalline silicon region 22S to the interface 18 is depicted by arrows 25 in FIG. 1C. Upon completion of this solid phase epitaxial regrowth, the anneal temperature is increased to approximately 900–950° C. in an inert atmosphere (e.g. nitrogen) to remove any remaining defects or states, thereby converting the amorphous region 22A (FIG. 1B) into a substantially pure single crystal region 26 (FIG. 1C) devoid of the twins 14 and the bandgap states 16 (FIG. 1A).

Figure 1D:
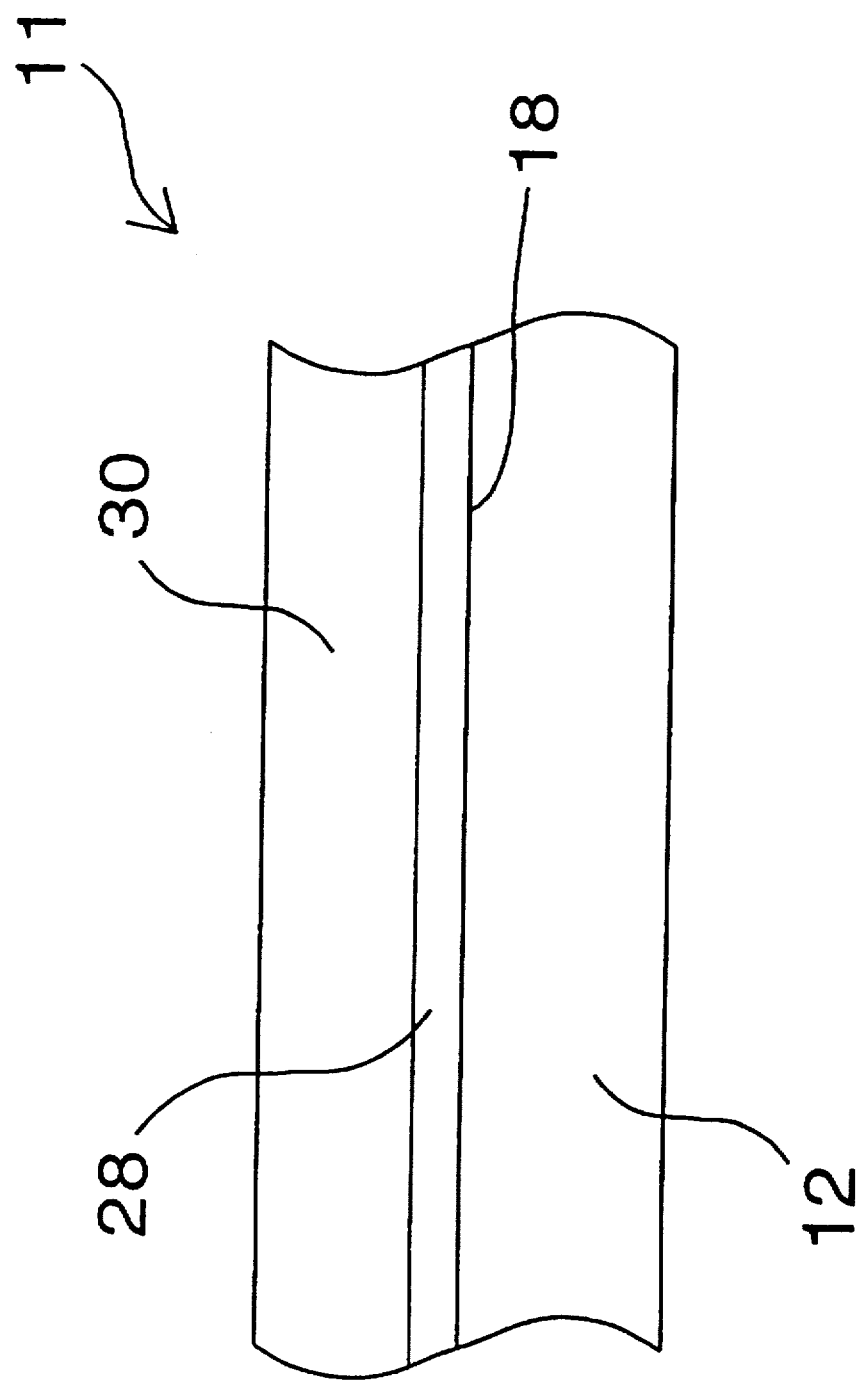

As shown in FIG. 1D, a silicon dioxide region 30 having a thickness of approximately 360 nm is then grown in the monocrystalline silicon region 22S by converting the ambient gas in the annealing system from nitrogen to an oxidizing ambient (e.g. steam or oxygen). The silicon dioxide region 30 is sufficiently thick to consume all the remaining twins 14 and band gap states 16 in the surface region 22S (FIG. 1C) of the silicon film 22. The silicon dioxide region 30 is sufficiently thick to leave an approximately 110 nm thick region of substantially pure silicon 28 (i.e., containing substantially zero defects and bandgap states) immediately adjacent the sapphire substrate 12.

Figure 1E:
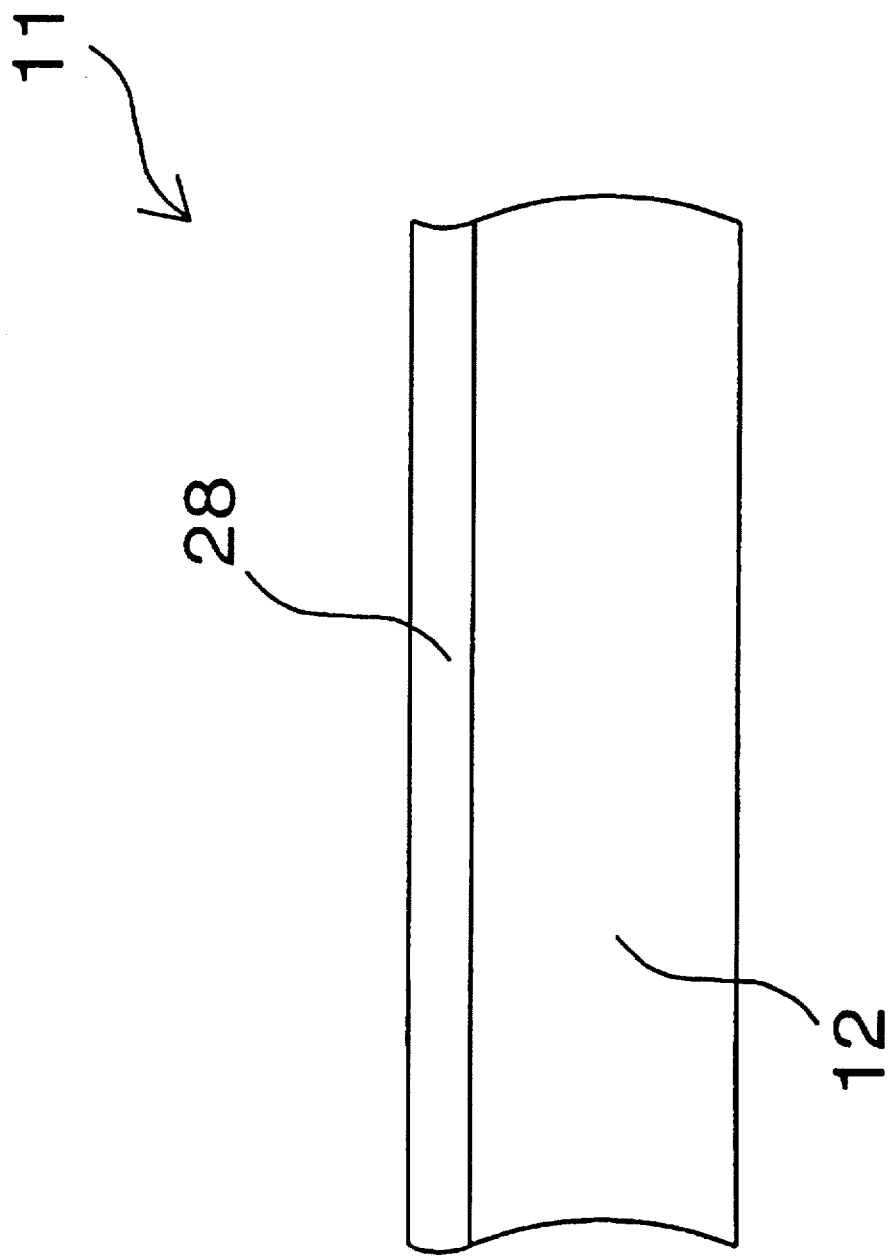

Referring now to FIG. 1E, the silicon dioxide film 30 is removed (etched) to result in an approximately 110 nm thick substantially pure silicon film 28 on the sapphire substrate 12. Thus, referring to FIG. 1C, the twins 14 and the states 16 in the upper portion of the silicon film are removed by forming the silicon dioxide film 30 and etching it away. Removal of the silicon dioxide film 30 may be delayed if it could serve a masking or other purpose. The substantially pure silicon film 28 on the sapphire substrate 12 is now suited for MOSFET fabrication.

The above process of the present invention advantageously produces the substantially pure ultrathin silicon film 28 and reduces processing costs and complexity by using only one implant cycle and one anneal cycle.

Design and fabrication of fully depleted MOSFET's are described with reference to FIGS. 2 and 3. In all of the below described embodiments, all of the MOSFET processing steps are preferably limited to temperatures less than approximately 950° C. in order to maintain the purity of the silicon in channel regions. Additionally, all anneals performed in non-oxidizing conditions are performed at temperatures less than approximately 950° C.

In one MOSFET embodiment, formation of isolated N-type and P-type regions in the silicon layer 28 is accomplished using a process often referred to as "local oxidation of silicon" (LOCOS). Unless otherwise stated, it will be understood throughout that there may be other standard semiconductor processing steps which will achieve the same or functionally similar results as described below. Substitution of these alternatives are considered to be within the scope of the present invention as long as they do not result in a processing step performed in non-oxidizing conditions which subjects the silicon layer 28 or any subsequent regions fabricated in the silicon layer 28 to temperatures in excess of approximately 950° C. For example, instead of using the LOCOS process to form the isolated N-type and P-type regions, alternative isolation techniques may also be employed. One such alternative process etches the silicon layer 28 (FIG. 1E) into individual islands (sometimes called "mesas"), to form the isolated N-type and P-type regions. Additional alternative processing procedures are disclosed in a book entitled "VLSI Technology", Second Edition, edited by S. M. Sze, published by McGraw-Hill, New York, 1988, hereby incorporated herein by reference.

Figure 2A:
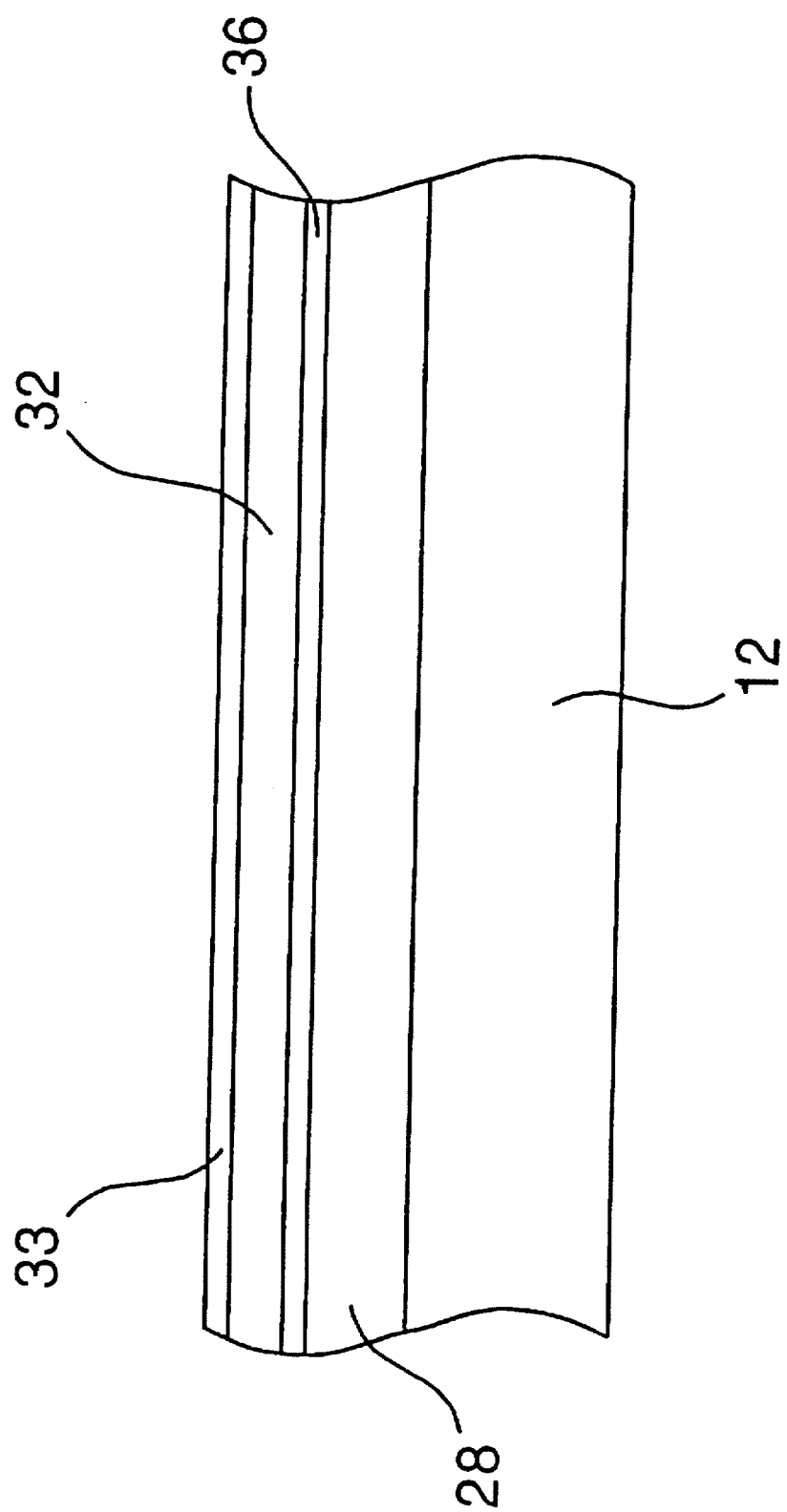
FIGS. 2A–2E illustrate a MOSFET and fabrication process steps used to manufacture the MOSFET in substantially pure silicon on sapphire material. Cross sectional views are shown for both N– and P-type transistors. These figures show the device and process through the first level of metallization.
Figure 2B:
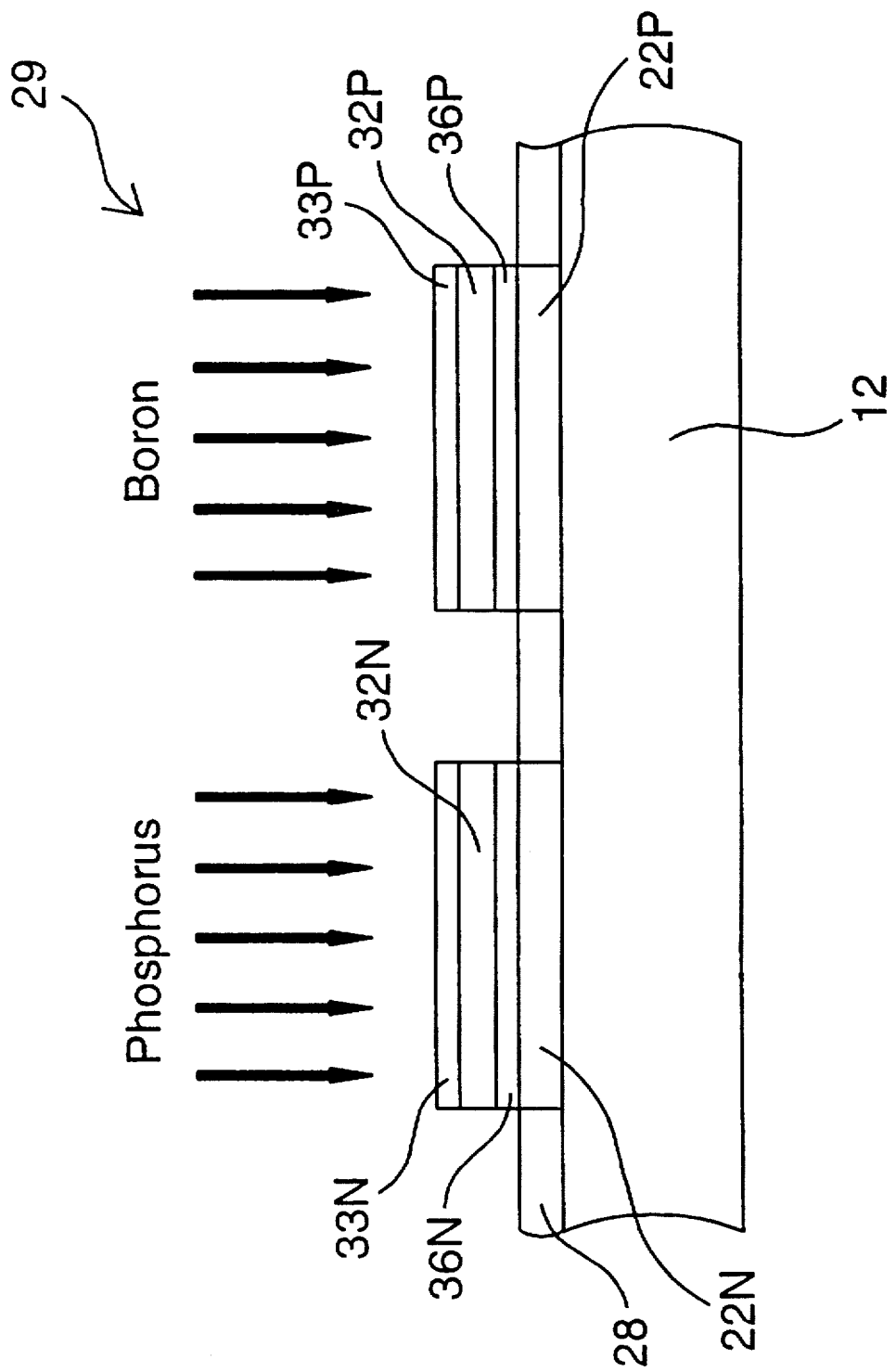
Figure 2C:
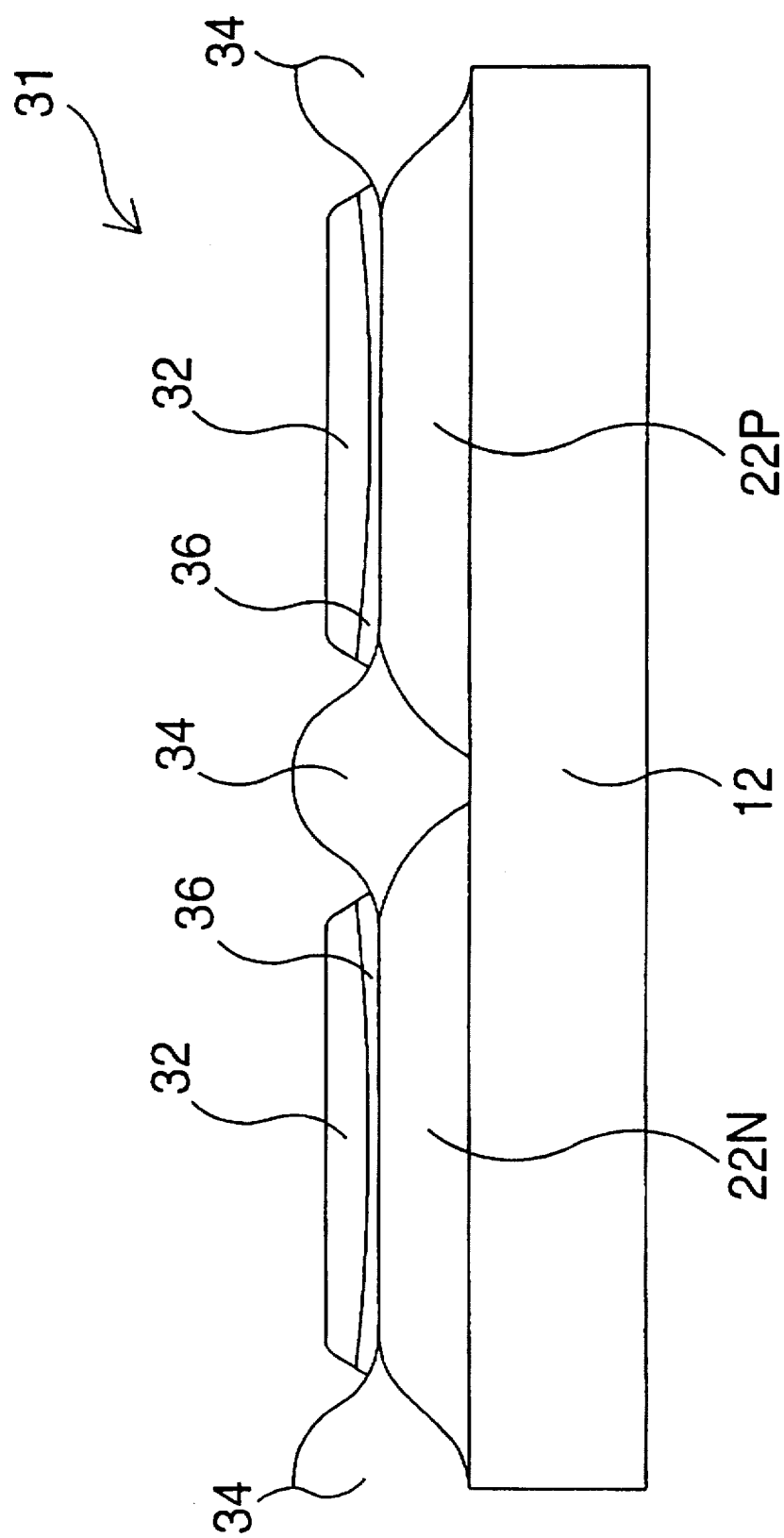

As shown in FIG. 2A, formation of isolated N-type and P-type regions with the LOCOS process begins with the deposition of a silicon dioxide layer 36, a silicon nitride layer 32 and a photo-resist layer 33 on top of the silicon layer 28 of the silicon-on-sapphire wafer 11 shown in FIG. 1E. Using standard masking and etching processes, individual islands (36p, 32p, 33p) and (36n, 32n, 33n) of the silicon dioxide layer 36, silicon nitride layer 32 and photo-resist layer 33 are formed on the surface of the Silicon layer 28 as shown in FIG. 2B. Standard masking and ion implantation techniques are used to form a silicon N-type region 22N and a silicon P-type region 22P. For example, as shown in FIG. 2B, the silicon N-type region 22N is formed by ion implantation of the Silicon layer 28 underlying the island (36n, 32n, 33n) with phosphorus and the silicon P-type region 22P is formed by ion implantation of the Silicon layer 28 underlying the island (36p, 32p, 33p) with phosphorus. As shown in FIG. 2C, the silicon N-type region 22N is isolated from the silicon P-type region 22P by the growth of a silicon dioxide region 34. The silicon dioxide regions 34 are grown by introducing the wafer 29 shown in FIG. 2B into a high temperature (less than approximately 950° C.) oxidizing ambient environment. The silicon dioxide isolation regions 34 extend down to the sapphire substrate 12. Although the wafer 29 is in an oxidizing ambient, the silicon nitride layer 32 shields the silicon regions 22N and 22P, thereby keeping those regions from oxidizing. After growing the isolation regions 34, the silicon nitride layer 32 and the stress relief oxide layer 36 are stripped away.

FIG. 2C shows regions 22N and 22P fully isolated from each other by the silicon dioxide isolation regions 34 for complementary MOS transistors. Alternative isolation techniques may also be employed. For example, the silicon layer 28 (FIG. 1E) may be etched into individual islands (sometimes called "mesas"). Thus, upon removal of the silicon dioxide regions 34 by etching, the silicon islands 22N and 22P become individual isolated islands or mesas.

Figure 2D:
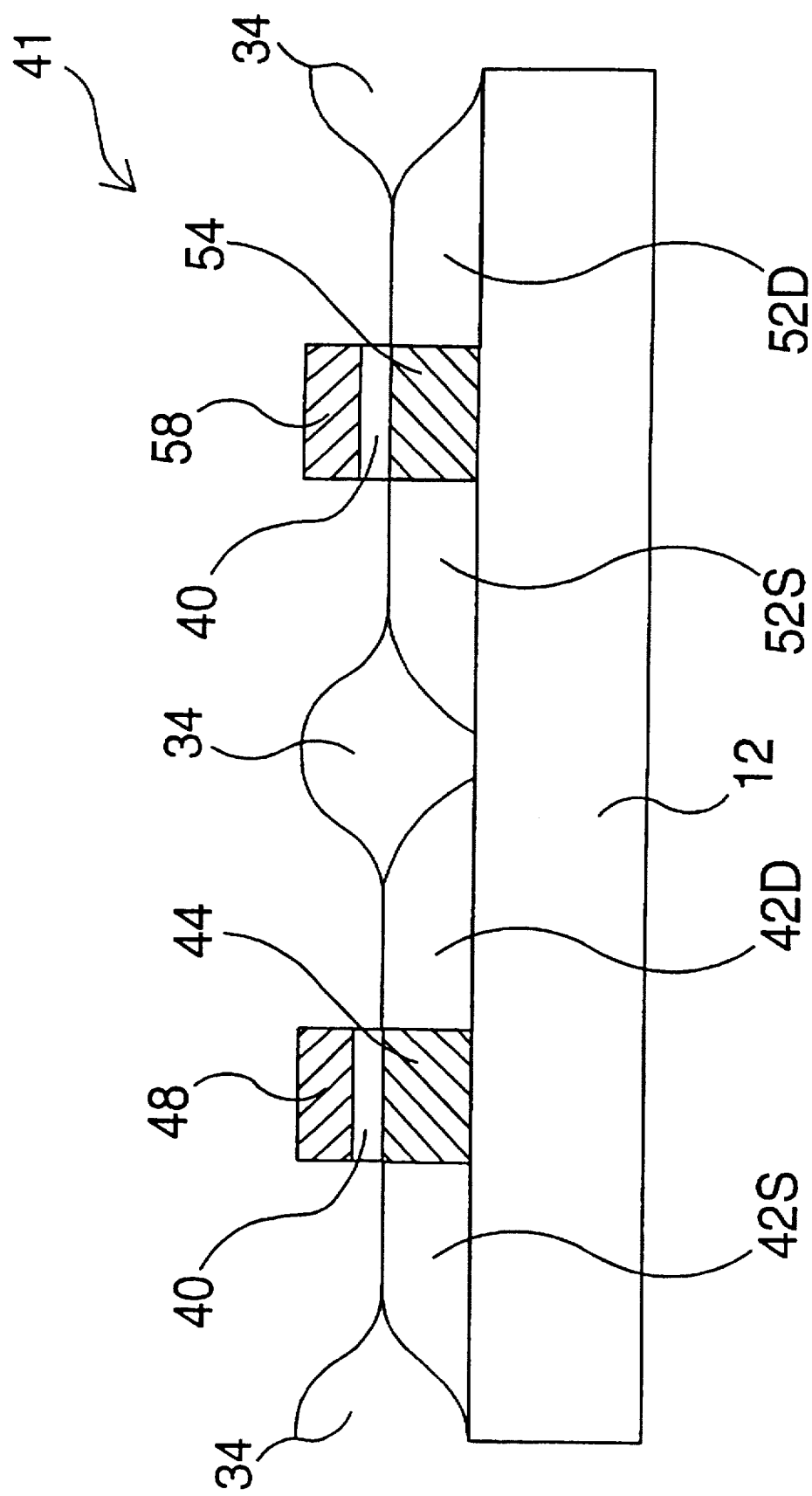

A subsequent stage 41 of the MOSFET process is shown in FIG. 2D. In stage 41, the N-type and P-type regions 22N and 22P (FIG. 2C) are further processed to form self aligned sources 42S and 52S, conduction regions 44 and 54, and self aligned drains 42D and 52D, respectively. Additionally, gate insulators 40 and gate conductive layers 48 and 58 form a control gate structure. The control gate structure is formed by thermal oxidation of the gate insulators 40 followed by deposition and patterning of a chosen gate conductive layer 48 for the P-channel and 58 for the N-channel. For electrostatic reasons, it is preferred that the gate length, i.e., the distance separating the source 52S from the drain 52D, be maintained at more than about 5–10 times the thickness of the conduction region. For example, a 500 nm gate length should be made in a silicon film thinner than about 100 nm, and preferably closer to 50 nm.

Referring to FIG. 2D, self aligned sources and drains 42S, 42D, 52S and 52D are formed by ion implantation or diffusion. Doping the source and drain regions of thin silicon films is subject to certain limitations. For example, ion implantation doping can amorphize the entire thickness of the source/drain region. An amorphized film will not properly recrystallize from the sapphire substrate and high resistivity may result. Therefore, it is preferable that the source and drain regions be formed by diffusion doping since the sapphire substrate forms a diffusion barrier to the dopant atoms. Diffusion doping of the source/drain regions represents an improvement over conventional MOSFET designs using implantation doping in that very thin (i.e., shallow) source/drain regions 42S, 42D, 52S and 52D having low resistivities can be fabricated by means of a single diffusion step.

Since the sapphire substrate 12 is an effective diffusion barrier and since the depth of the source and drain regions 42S, 42D, 52S and 52D are determined by the thickness of the silicon film, forming shallow source and drain regions is controlled by the structure, not by diffusion time and temperature, as in conventional transistor processing. Therefore diffusion doping can be used for scaled down dimensions. Diffusion doping has several advantages over ion implantation including: the host silicon is not damaged or transformed into amorphous regions; the process is inherently scalable to the thinnest silicon films; and higher doping concentrations can be achieved.

Threshold voltage of the control gate structure is initially determined by correctly choosing the gate conductor material according to its so-called metal work function. If necessary, further adjustments to the threshold voltage are made by introducing appropriate dopant atoms into the conduction channel, for example by ion implantation into the conduction regions 44 and 54. In accordance with the present invention, no dopant atoms other than those introduced for threshold adjustment (or to ensure surface channel conduction, see below) are present in the conduction channel regions 44 and 54. The absence or low concentrations of dopants in the MOSFET embodiments of the present invention represent an improvement over traditional MOSFET designs wherein substantial concentrations of dopant atoms are typically present for various reasons (e.g., as integral parts of traditional transistors; to provide isolation; as a byproduct of counterdoping; etc.). By fabricating MOSFETs in substantially pure silicon on sapphire in accordance with the present invention, only minimal concentrations of dopant atoms (if any) are present, thereby eliminating parasitic charge and its associated degradations discussed above.

Gate conductor layers 48 and 58 are often multilayer structures. In this case, the threshold voltage is determined by the characteristics of the primary gate conductor layer, i.e., the layer which is immediately adjacent the gate insulator 40. Conductive layers above the primary gate conductor layer are included for various reasons, especially to reduce series resistance (See FIG. 3 and discussion below for an example). However, such secondary gate conductive layers do not affect the threshold voltage of transistors. Each of the gate materials cited below has various applications when the material is in contact with the gate insulator 40.

$P^+$ and $N^+$ polysilicon gate materials, used in various combinations in N-type MOSFETS and P-type MOSFETS, are useful in designing and fabricating digital and analog circuits, voltage reference circuits and memory type circuits. $P^+$ polygermanium is a good choice for high performance digital logic where symmetric threshold voltages for N- and P-type MOSFETs are desired. Any conductive material which has a metal work function at the center of silicon's band gap (i.e., equal to silicon's electron affinity plus half the band gap or more specifically a metal work function of 4.5–4.7 eV) results in symmetric threshold voltages for N- and P-channel MOSFETs. Examples of such materials are tungsten, chrome, indium tin oxide, and titanium nitride, among others. The material may be different or the same for each transistor type (regions 48 and 58) depending on the desired threshold voltage. Examples of choice of material and resultant threshold voltages are approximately as follows:

$N^+$ polysilicon gate conductor results in $V_{tn}=0$ V and $V_{tp}=-1$ V;

$P^+$ polysilicon gate conductor results in $V_{tn}=+1$ V and $V_{tp}=0$ V;

$P^+$ polygermanium, tungsten, indium tin oxide or titanium nitride gate conductors result in $V_{tn}=+\frac{1}{2}$ V and $V_{tp}=-\frac{1}{2}$ V;

where $V_{tn}$ and $V_{tp}$ are the threshold voltages of N- and P-channel MOSFETs, respectively.

As can be seen from the above discussion and referring to FIG. 2D, if a threshold voltages of +1 Volt for the N-channel and –1 Volt for the P-channel were desired, region 48 could be $P^+$ polysilicon and region 58 could be $N^+$ polysilicon (i.e., different materials). If threshold voltages of +½ Volt for the N-channel and –½ M Volt for the P-channel were desired, regions 48 and 58 could be $P^+$ polygermanium, tungsten, indium tin oxide or titanium nitride (i.e., the same material). Numerous other material choices, and therefore other choices of threshold voltages, are also available.

The gate dielectric material 40 is grown and the gate conducting materials 48 and 58 are deposited using process conditions which avoid introduction of states or fixed charges into the channel regions 44 and 54. Specifically, processing temperatures and ambients are chosen to avoid generation of interface states or fixed charge in the dielectric. Therefore, as previously discussed, processing temperatures should be kept below approximately 950° C. Also, for $P^+$ doped conductors as gate material 48 or 58, processing temperatures, times and ambients should be chosen to avoid diffusion of the dopant atoms from the gate conductors 48 and 58 through the gate dielectric insulator 40 into the silicon films 44 and 54. Diffusion barriers such as silicon nitride as part of the gate dielectric insulator 40 can be used to prevent such dopant migration.

Use of metal work function exclusively (i.e., no dopant atoms introduced into the conduction region) to set threshold voltage has the desirable effect of accurate and predictable threshold voltage control which is independent of process variations or certain device parameters.

Surface channel transistor behavior occurs when conduction occurs in the silicon channels 44 and 54 at the interface between the gate insulator 40 and the silicon films 44 and 54. In some designs, it may be desirable to intentionally induce surface channel conduction. This may be accomplished by implanting very small amounts of dopant atoms into the substantially pure silicon channel regions 44 and 54. This will result in surface channel conduction without significantly affecting the threshold voltage. Such a device is defined herein as an "intrinsic surface channel MOSFET." Additional dopant atoms, such as boron, phosphorous or arsenic, may be introduced into the channel regions 44 and 54 to further adjust the threshold voltage of the intrinsic surface channel MOSFET. Addition of dopant atoms in excess of that necessary to adjust the threshold voltage may introduce some of the adverse effects cited earlier, such as impurity scattering and possible threshold voltage variation. However, a device constructed in accordance with this invention contains only the dopant atoms necessary to induce surface channel conduction and to set threshold voltage. Therefore, none of the other parasitic charge found in traditional MOSFETs are present. The present invention thereby minimizes the dopant charge in regions 44 and 54 and associated adverse effects associated with higher concentrations of dopant charge.

A maximum amount of dopant charge can be introduced into channel regions 44 and 54. If the maximum amount is exceeded, the depletion region will not reach the sapphire 12, thus eliminating fully depleted operation. The maximum dopant charge is dependent on the silicon film thickness in the channel regions 44 and 54. For the preferred embodiment, the regions 44 and 54 are approximately 100 nm thick and the maximum dopant density is approximately $1\times10^{12}$ cm$^{-2}$.

Figure 2E:
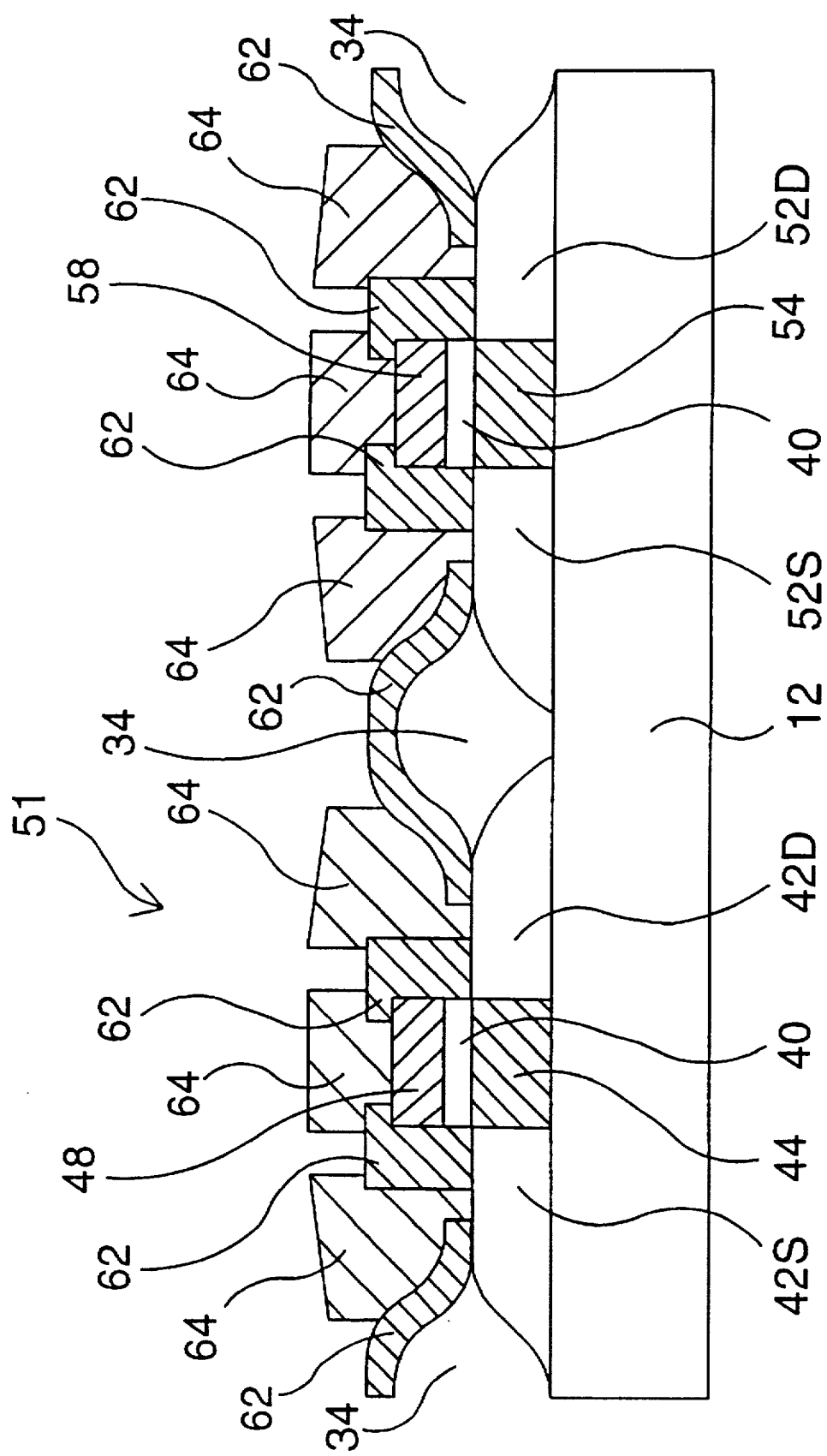

A next stage 51 of the MOSFET fabrication process is shown in FIG. 2E. In this stage, insulating layer 62 and metal layer 64 are deposited and patterned for interconnecting devices as desired. Specifically, an interlevel insulating layer 62 is deposited and patterned, followed by deposition and patterning of a metallic conductor interconnecting layer 64. Additional layers of insulators and metallic conductors may be added as needed (not shown). Another advantage of the present invention is apparent at this point, there are no opportunities for metal to diffuse into the source and drain regions as in many conventional MOSFET fabrication processes. In the present invention, after deposition and patterning of the metallic interconnect layer 64, an annealing step is performed. This annealing step serves two primary functions: to remove states and charge which may have been introduced during the previous processing steps and to sinter different metallic layers to form low resistance contacts. In conventional processing, source and drain junctions are deep enough to ensure that no metal will diffuse through them and into an underlying silicon substrate, thereby destroying transistors. In the current invention, such a failure mechanism does not exist since only sapphire 12 is found beneath the source and drain regions 42S, 42D, 52S and 52D.

Figure 3A:
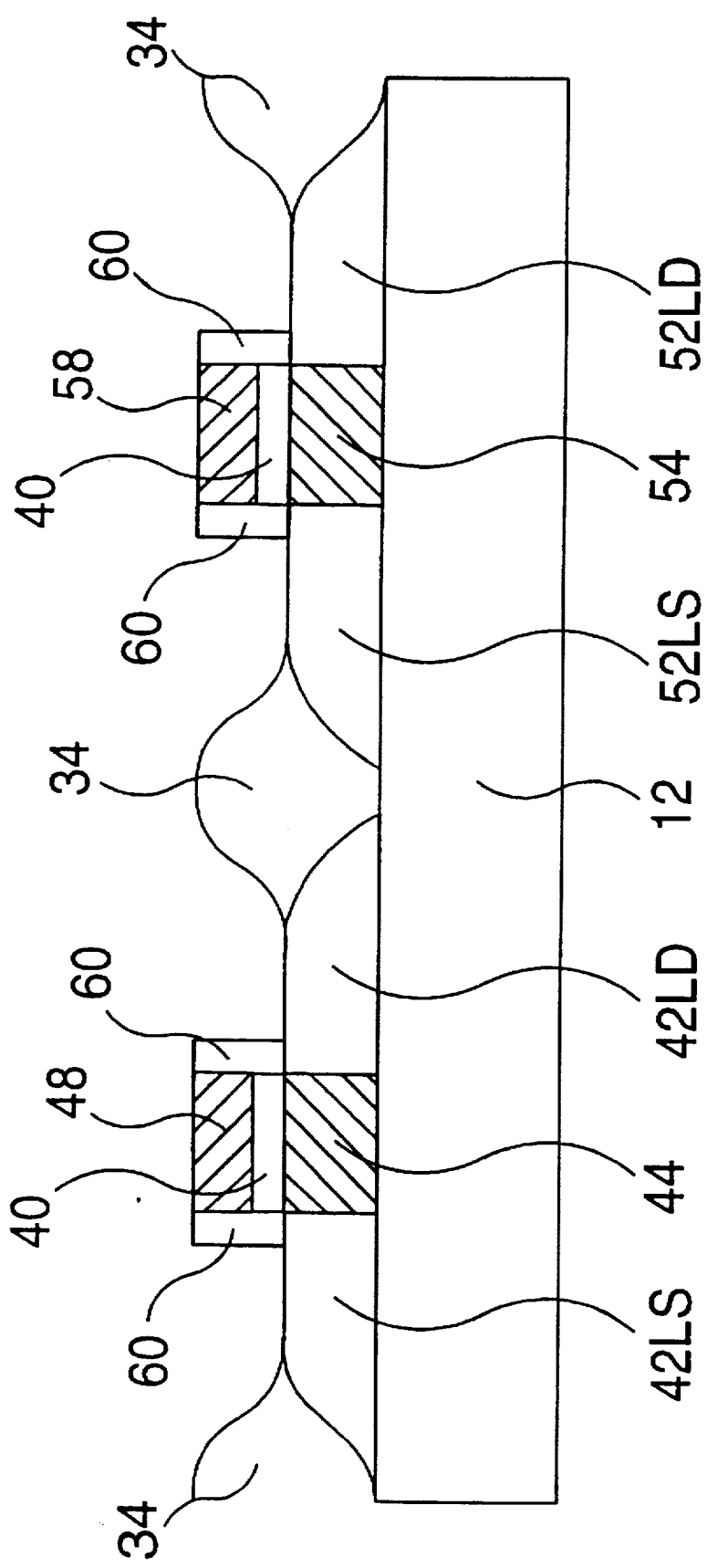
FIGS. 3A–3C illustrate an embodiment of the invention comprising adding to the device and process depicted in FIGS. 2, gate sidewall spacers, lightly doped drains (LDD), and self aligned silicide (salicide). Cross sectional views are shown for both N- and P-type transistors. These figures show the device and process through the first level of metallization.
Figure 3B:
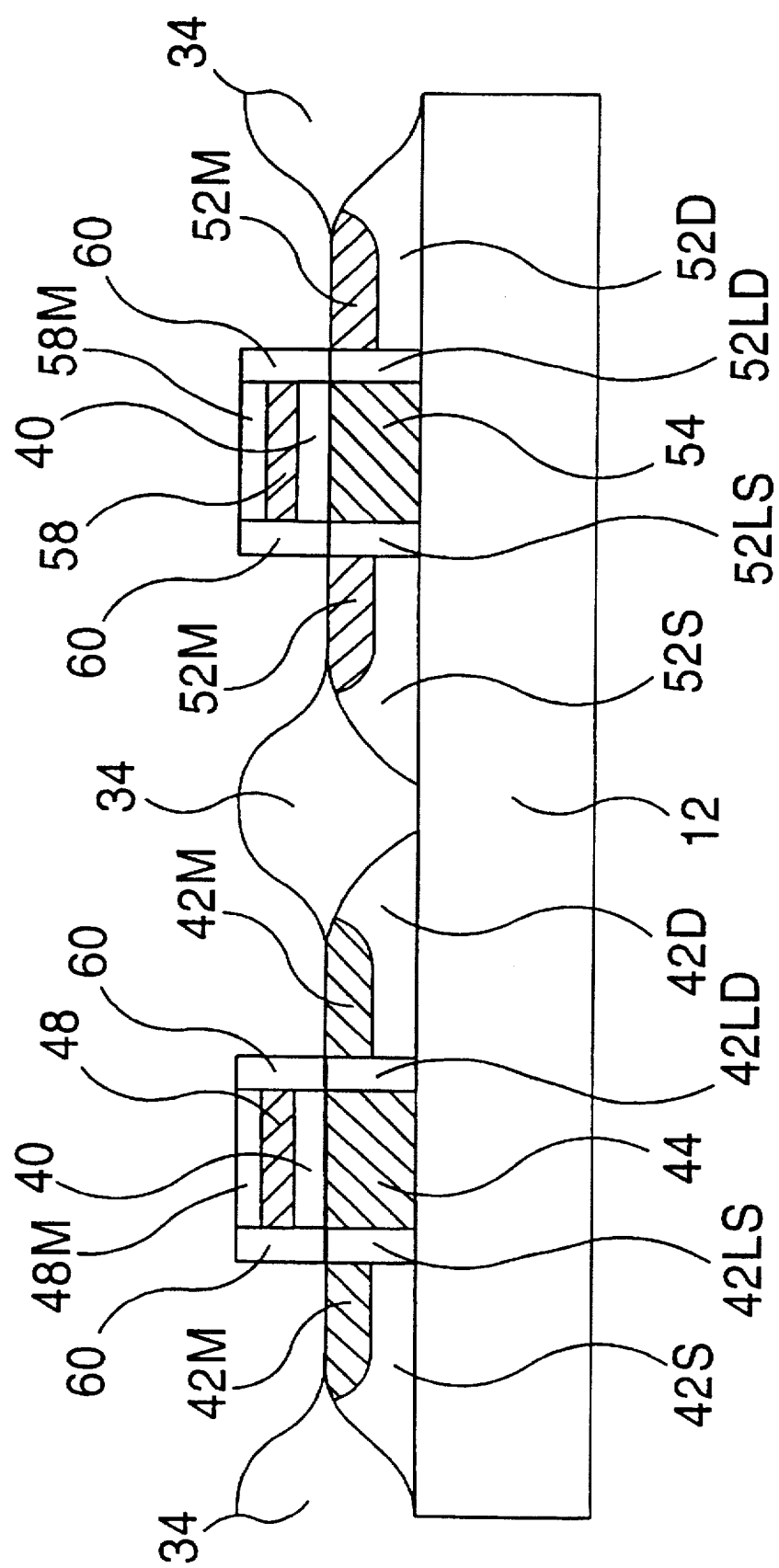
Figure 3C:
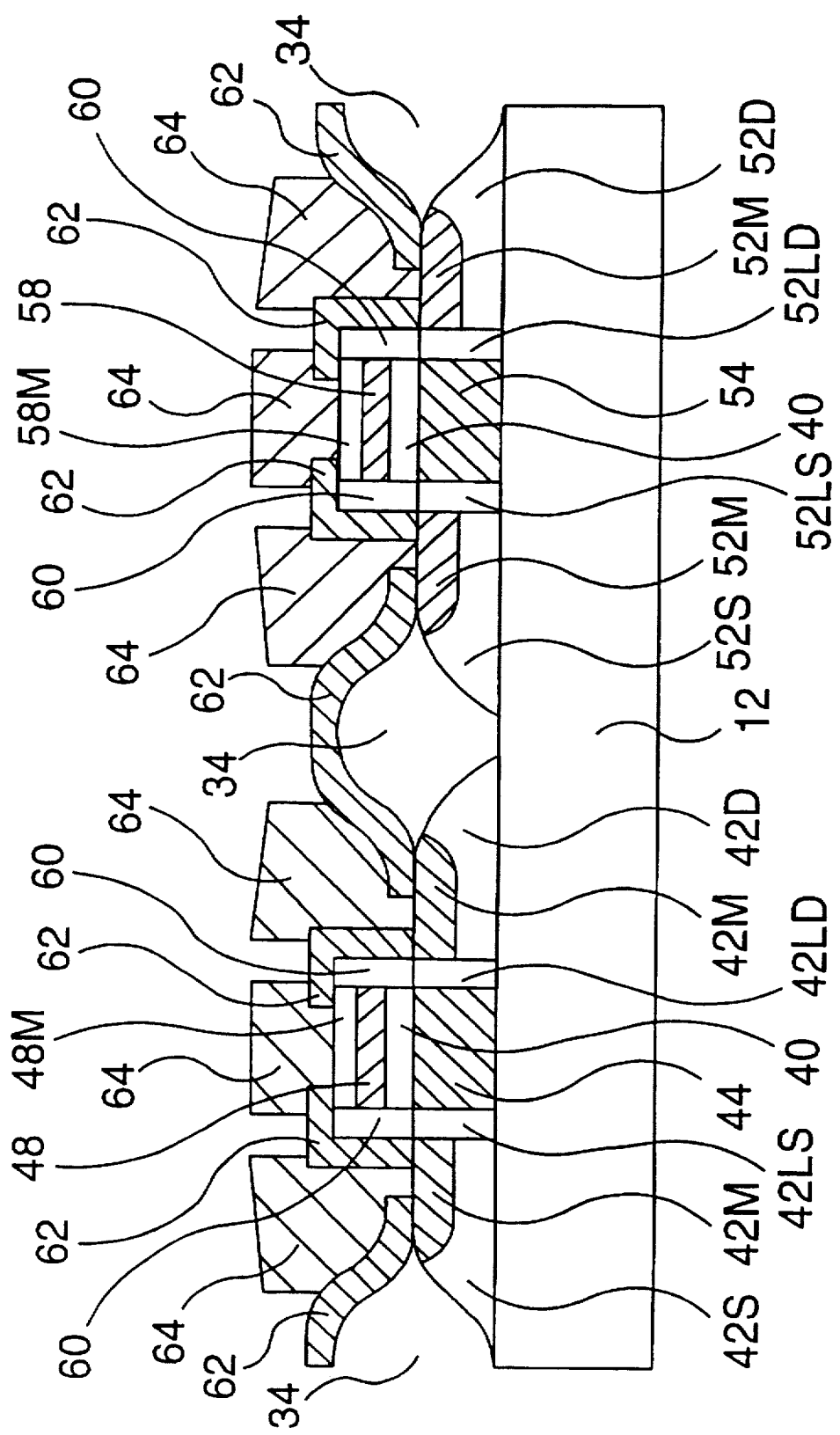

The current invention may also be embodied in a lightly doped drain (LDD) structure or self aligned silicide (salicide). This embodiment is illustrated in FIGS. 3A, 3B and 3C. This embodiment may be implemented after the gate conductors 48 and 58 are patterned as discussed above and shown in FIG. 2D. Referring to FIG. 3A, after patterning the gate conductors 48 and 58, self aligned lightly doped drain (LDD) regions 42LD and 52LD are formed by ion implantation or diffusion. The LDD reduces electric fields, thereby improving reliability and certain device characteristics such as drain breakdown voltage. However, the LDD also increases series resistance at both the drain and source, thereby decreasing output current. A trade-off is therefore inherent in the choice of an LDD and different requirements will lead to different LDD designs. The advantages cited above for diffusion doping of the self aligned sources and drains 42S, 42D, 52S and 52D also apply to doping the LDD structures.

In the self aligned silicide (salicide) embodiment of the present invention, a sidewall spacer 60 is deposited and etched adjacent to the gate structure comprising the gate insulator 40 and conductor 48, 58. Referring to FIG. 3B, final self aligned sources and drains 42S, 42D, 52S and 52D are formed by ion implantation or diffusion. For appropriate gate conductors 48 and 58 (such as polysilicon or polygermanium) the structure is coated with a metallic material and reacted to form metallic compounds 48M and 58M in the upper portion of gate conductors 48 and 58 as well 42M and 52M in source and drain regions 42S, 42D, 52S and 52D. Stripping unreacted metal from sidewall spacers 60 completes the salicide (or germanide) processing. Referring to FIG. 3B, silicide regions 42M, 52M, 48M, and 58M are separated from each other by the sidewall spacers 60. The thickness of metallic regions 42M, 48M, 52M and 58M is controlled by the amount of metallic material which is deposited. Obviously, the salicide option exists independently of LDD doping level. Referring to FIG. 3C, a complementary MOS structure is shown with both LDD and salicide options included after metallization as described above for FIG. 2. Many other materials and processing options can be used in addition to or in replacement of those described above. It is to be understood that such choices may be practiced within the scope of this invention.

It will be understood that the apparatus and method of the present invention for a Minimum Charge FET Fabricated on an Ultrathin Silicon on Sapphire Wafer may be employed with many dimensions and designs typical of such devices. Thus, there are numerous other embodiments of the invention which will be obvious to one skilled in the art, including but not limited to changes in the dimensions of the regions forming the devices, the type of processes used to fabricate devices, the specific circuit designs, etc. Additionally, one skilled in the art will realize that the apparatus and method of the present invention may be embodied in other specific forms without departing form its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

We claim:

1. A transistor formed in an intrinsic silicon layer on a sapphire substrate wherein said silicon layer is less than approximately 270 nm thick and has an areal density of electrically active states in regions not intentionally doped which is less than approximately $5\times10^{11}$ cm$^{-2}$, said transistor made by the process comprising the steps of:

epitaxially depositing a layer of silicon on a surface of a sapphire substrate;

implanting a given ion species into said layer of silicon under such conditions that said implanted ions form a buried amorphous region in said silicon layer which extends substantially from said surface of said sapphire substrate into said layer of silicon, thus leaving a surface layer of monocrystalline silicon covering said buried amorphous region;

selecting an areal portion of said silicon on sapphire and maintaining said areal portion at or below a temperature of approximately zero degrees centigrade (0° C.) such that the temperature throughout said areal portion is substantially uniform during said ion implanting step;

annealing the wafer to induce solid phase epitaxial regrowth of said buried amorphous region using said surface layer of monocrystalline silicon as a crystallization seed; and controlling the temperature of said layer of silicon to temperatures of less than or equal to approximately 950° C. during any annealing and/or processing procedures performed subsequent to said ion implanting step which expose said layer of silicon to a non-oxidizing ambient environment, thereby maintaining an areal density of electrically active states in regions of said silicon layer not intentionally doped which is less than approximately $5\times10^{11}$ cm$^{-2}$.

2. A transistor made by the process defined in claim 1 further comprising the step of forming a channel region in said layer of silicon which is intentionally doped to adjust a threshold voltage of said transistor.

3. A transistor made by the process defined in claim 1 wherein said transistor is a MOSFET.

\* \* \* \* \*